(12) United States Patent
Roy et al.

(10) Patent No.: US 9,552,859 B2
(45) Date of Patent: Jan. 24, 2017

(54) ELECTRONIC MEMORY INCLUDING ROM AND RAM

(71) Applicant: Purdue Research Foundation, West Lafayette, IN (US)

(72) Inventors: Kaushik Roy, West Lafayette, IN (US); Dongsoo Lee, White Plains, NY (US); Xuanyao Fong, Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 14/723,450

(22) Filed: May 27, 2015

(65) Prior Publication Data

US 2015/0371695 A1 Dec. 24, 2015

Related U.S. Application Data

(60) Provisional application No. 62/003,212, filed on May 27, 2014.

(51) Int. Cl.
*G11C 11/00* (2006.01)
*G11C 11/16* (2006.01)

(52) U.S. Cl.
CPC ........ *G11C 11/1673* (2013.01); *G11C 11/1659* (2013.01); *G11C 11/1655* (2013.01)

(58) Field of Classification Search
None
See application file for complete search history.

(56) References Cited

U.S. PATENT DOCUMENTS

| 5,757,690 A * | 5/1998 | McMahon ............... G06F 8/66 365/104 |
| 2002/0089024 A1* | 7/2002 | Iwata ................... B82Y 10/00 257/421 |
| 2007/0047291 A1* | 3/2007 | Hoenigschmid ... G11C 13/0004 365/148 |

(Continued)

OTHER PUBLICATIONS

Wolf, S., et al., The Promise of Nanomagnetics and Spintronics for Future Logic and Universal Memory. IEEE Proceedings of the IEEE, vol. 98, No. 12, Dec. 2010, 2155-2168.

(Continued)

*Primary Examiner* — Son Dinh
*Assistant Examiner* — Uyen B Tran
(74) *Attorney, Agent, or Firm* — Purdue Research Foundation

(57) ABSTRACT

An electronic data-storage apparatus having ROM embedded in an STT-MRAM. The apparatus comprises at least two bit lines, a plurality of bit cells, each including, connected to a source line (SL), a series connection (in any order) of a selection element (e.g., transistor gated by word line WL), a resistive storage element (e.g., MTJ), and a permanent connection to one of the bit lines (e.g., BL0, BL1). The apparatus may also include a ROM sense amplifier which is configured to precharge two output nodes connected to respective ones of the bit lines, so that the jumper in a selected memory cell pulls one of the output nodes to a first reference potential (e.g., GND) and the ROM sense amplifier pulls the other of the output nodes to a second reference potential (e.g., Vdd).

6 Claims, 8 Drawing Sheets

(56) References Cited

U.S. PATENT DOCUMENTS

2009/0201717 A1* 8/2009 Maeda .................. G11C 11/16
 365/148
2012/0257445 A1* 10/2012 Lee ....................... G11C 5/063
 365/158

OTHER PUBLICATIONS

Lee, D., et al., Area Efficient ROM-Embedded SRAM Cache. IEEE Transactions on Very Large Scale Integration (VLSI) Systems, vol. 21, No. 9, Sep. 2013, 1583-1595.

Park, S., et al., "Future Cache Design using STT MRAMs for Improved Energy Efficiency: Devices, Circuits and Architecture.", In Proc. DAC, Jun. 2012, pp. 492-497.

Ikeda, S., et al., Magnetic Tunnel Junctions for Spintronic Memories and Beyond. IEEE Transactions on Electron Devices, vol. 54, No. 5, May 2007, 991-1002.

Dorrance, R., et al., Scalability and Design-Space Analysis of a 1T-1MTJ Memory Cell for STT-RAMs. IEEE Transactions on Electron Devices, vol. 59, No. 4, Apr. 2012, 878-887.

Fong, X., et al., KNACK: A Hybrid Spin-Charge Mixed-Mode Simulator for Evaluating Different Genres of Spin-Transfer Torque MRAM Bit-cells. IEEE, 2011, In Proc. SISPAD, Sep. 2011, pp. 51-54.

Coming, D., et al., Velocity-Aligned Discrete Oriented Polytopes for Dynamic Collision Detection. IEEE Trans. Visualization and Computer Graphics, vol. 14, No. 1, pp. 1-12 (2008).

Iijima, M., et al., Ultra Low Voltage Operation with Bootstrap Scheme for Single Power Supply SOI-SRAM. In Proc. VLSI Design, Jan. 2007, pp. 609-614.

Goto, H., et al., Efficient Scheduling Focusing on the Duality of MPL Representation. Proceedings of the 2007 IEEE Symposium on Computational Intelligence in Scheduling (CI-Sched 2007).

Lin, C., et al., 45nm Low Power Cmos Logic Compatible Embedded STT MRAM Utilizing a Reverse-Connection 1T/1MTJ Cell. In IEEE IEDM Digital Tech., Dec. 2009, pp. 279-282.

Carter, C., et al., OxygenA bsorptionM easurementsin the Lower Atmospher. J. Geophysical Research, vol. 73, No. 10, 3113-3120 (1968).

Hubert, L., et al., Comparing Partitions, J. Classification 2:193-218 (1985).

Vidmar, R., On the Use of Atmospheric Pressure Plasmas as Electromagnetic Reflectors and Absorbers. IEEE Transactions on Plasma Science. vol. 18. No. 4. 733-741, Aug. 1990.

Perez, J., et al., Integrating Data Warehouses with Web Data: A Survey. A DB Technical Report (2006).

* cited by examiner

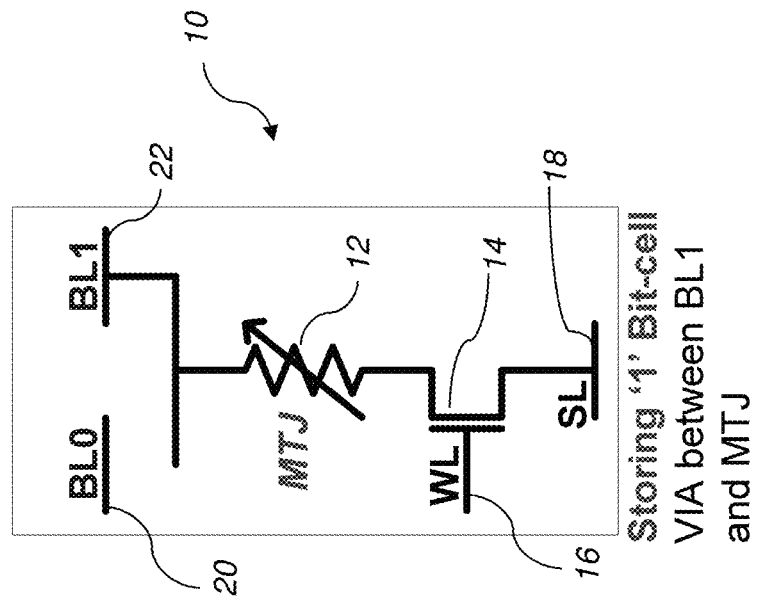
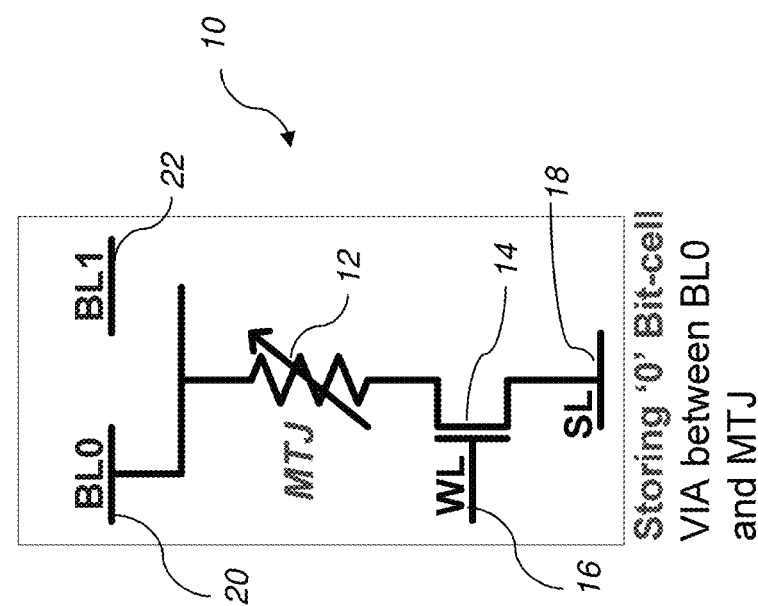

ELECTRONIC MEMORY INCLUDING ROM AND RAM

RELATED APPLICATIONS

The present application claims the benefit of U.S. provisional application Ser. No. 62/003,212, filed May 27, 2014, the contents of which are hereby incorporated by reference in its entirety.

TECHNICAL FIELD

The present application relates to electronic memories, and particularly to such memories including both read-only memory (ROM) and random-access memory (RAM) functions.

BACKGROUND

There is a need for increased storage density in memory, and increased flexibility in the use of different types of memory.

Reference is made to U.S. Pat. No. 8,059,442, published Nov. 15, 2011; to U.S. Pat. No. 7,791,921, published Sep. 7, 2010; to US20130094282, published Apr. 18, 2013; to U.S. Pat. No. 6,952,376, published Oct. 4, 2005; to US20130155759, published Jun. 20, 2013; to US20110085373, published Apr. 14, 2011; to US20130329488, published Dec. 12, 2013; to US20110122674, published May 26, 2011; to U.S. Pat. No. 8,194,444, published Jun. 5, 2012; and to US20120106241, published May 3, 2012, the disclosure of each of which is incorporated herein by reference.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 1A is a schematic showing a bit cell structure having ROM and RAM storage in a first ROM value state according to one embodiment.

FIG. 1B is a schematic showing a bit cell structure having ROM and RAM storage in a second ROM value state according to one embodiment.

The attached drawings are for purposes of illustration and are not necessarily to scale.

DETAILED DESCRIPTION

Throughout this description, some aspects are described in terms that would ordinarily be implemented as software programs. Those skilled in the art will readily recognize that the equivalent of such software can also be constructed in hardware, firmware, or micro-code. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Various aspects herein are applicable to many resistive RAM types. In general, these types sense resistance across a storage element and can be used, e.g., for on-chip caches.

Due to its non-volatility, zero stand-by leakage, and high density, spin-transfer torque (STT) magnetic random access memory (MRAM) is gaining wide interest as future on-chip memory. An STT MRAM bit-cell consists of an access transistor and a magnetic tunnel junction (MTJ) connected in series. It is possible to store one bit of information in an MTJ based on the relative magnetization of the free layer (FL) with respect to the magnetization of the pinned layer (PL). Reading the MTJ state is conducted by sensing the resistance of the MTJ ($R_{MTJ}$) using a current source to distinguish $R_P$ (the resistance when FL and PL are parallel, or the MTJ is in the P state) and $R_{AP}$ (the resistance when FL and PL are anti-parallel, or the MTJ is in the AP state).

According to one embodiment of the present disclosure, read-only memory (ROM) data is embedded into STT MRAM without increasing bit-cell area or incurring any performance degradation in conventional RAM operations. Compared to prior art ROM-embedded SRAM, the ROM-embedded STT MRAM (R-MRAM) of the present disclosure has larger ROM capacity (due to the smaller bit-cell footprint), and simpler ROM data retrieval process.

Figure 1C:
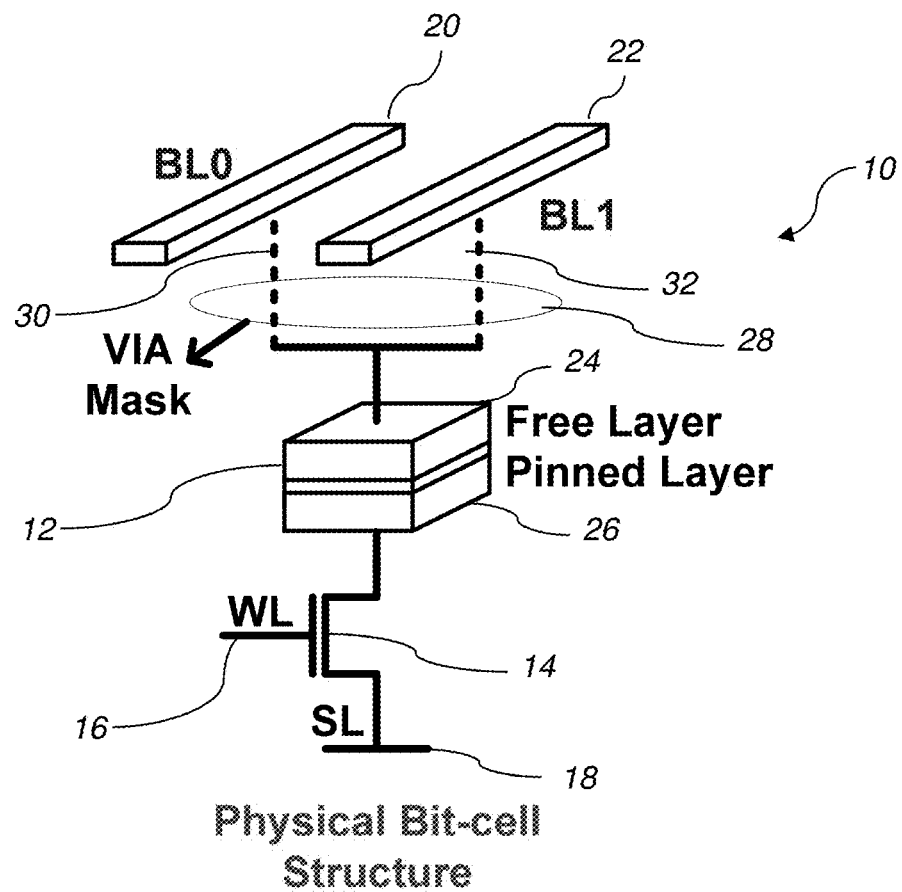
FIG. 1C is a schematic that shows a the bit cell structure of FIG. 1A with additional detail.

FIGS. 1A & 1B show one embodiment of a memory bit cell structure 10 according to the present disclosure which includes a magnetic tunnel junction (MTJ) 12 in series with a transistor 14. The magnetic tunnel junction 12 includes a free layer 24 and a pinned layer 26 as shown. The gate of the transistor 12 is connected to a word line (WL) 16, and the drain (or source) of the transistor 14 is connected to a source line (SL) 18 as shown. The MTJ 12 is connected to one of two bit lines 20 and 22. The value of the ROM is determined by which one of the bit lines 20 and 22 the MTJ is connected to. In FIG. 1A, the MTJ 12 is connected to the bit line 20, which corresponds to the "0" state. In the example of FIG. 1B, the MTJ 12 is connected to the bit line 22, which corresponds to the "1" state. One bit of ROM can be used for each bit of RAM. The bit lines 20 and 22 can be metal or other electrically conductive material. In various embodiments, the bit cell 10 and supporting circuits are deposited. The bit lines 20 and 22 may be deposited in, e.g., Metal 1 and 2, or Metal 4 and 5, after the RAM storage element is complete. Other RRAM technologies can be used in place of the MTJ 12, e.g., conductive-bridge RAM or PCRAM.

The bit-cell structure 10 of the R-MRAM of the present disclosure uses an additional bit-line compared to prior art STT-MRAM. ROM data is stored in the bit cell 10 by selectively connecting the MTJ 12 to one of the two bit-lines 20 and 22. A physical connection between the MTJ 12 and the bit-line is preferably accomplished using a via mask layer 28. Note that there is enough routing space in a typical STT MRAM bit-cell layout to include one more bit-line (e.g., bit line 20 or 22) because STT MRAM requires large access transistors to satisfy the bidirectional switching current requirement of the MTJ 12. The area of exemplary bit cells is dominated by the transistor, which has high width (W) and low length (L). The additional bit line can be added provided the width of the transistor is sufficiently large. The extra bit-line enables both normal RAM read/write operations and ROM read operations in R-MRAM such as device 10. The RAM is stored in the bit cell as normally done in standard STT-MRAM. The ROM is defined by creating a via (e.g. either 30 or 32) in the via mask 28. For example, refering to FIG. 1C, either via 30 or 32 would be created to connect the MTJ 12 to either bit line 20 or 22 (but not both) depending on the desired value of the ROM for that bit-cell. Multiple bit cells 10 would be typically included in a single memory chip or cache.

Figure 2A:
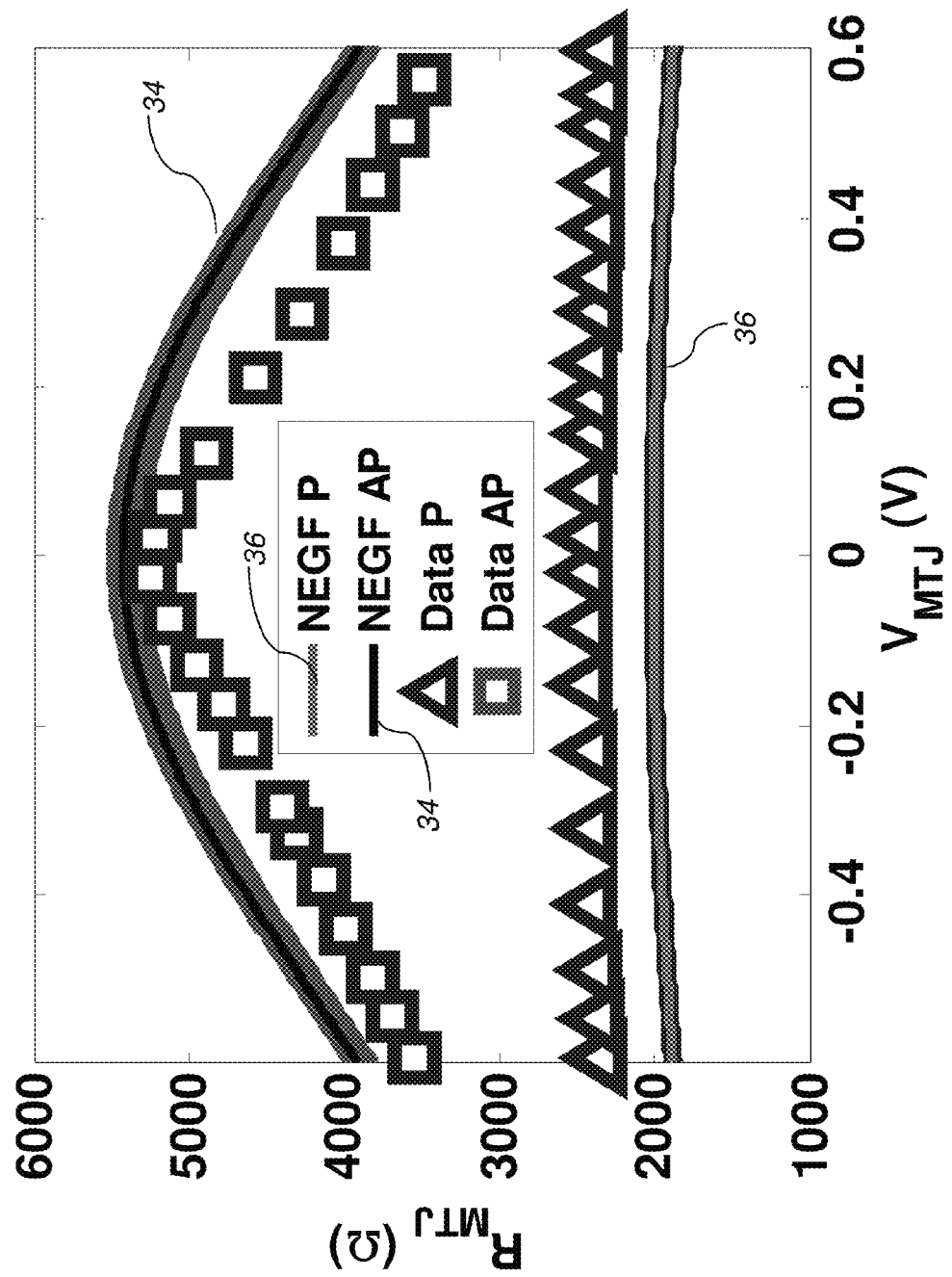
FIG. 2A shows resistance-voltage (R-V) characteristics of 50 test MTJs according to one embodiment.
Figure 2B:
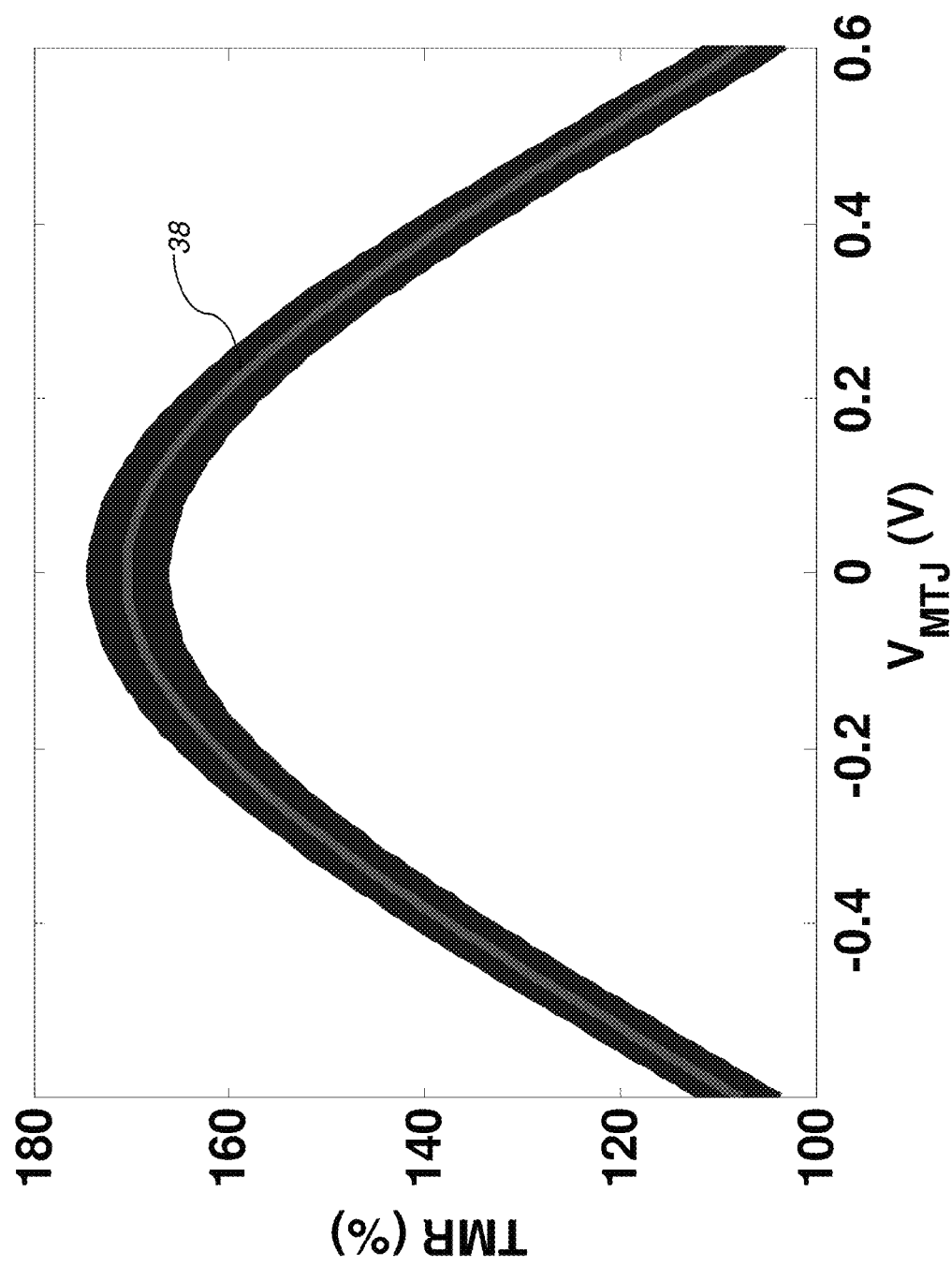
FIG. 2B shows TMR-voltage characteristics of the same 50 test MTJs of FIG. 2A.

Simulation Setup:

Comprehensive simulations were performed to validate ROM and RAM functionality of the proposed R-MRAM. FIG. 2A shows resistance-voltage (R-V) characteristics of 50 test MTJs with variations of $R_P$ ($\sigma/\mu=2\%$). FIG. 2B shows TMR-voltage characteristics of the same 50 test MTJs ($\sigma/\mu=3\%$). R-V characteristics at the nominal corner (30 and 32 in FIG. 2A and 38 in FIG. 2B) were calculated using a NEGF solver, which was calibrated to known experimental data. At the nominal corner, the MTJ used in our simulations has $R_P=2K\Omega$ and $R_{AP}=5.5$ $K\Omega$ when voltage drop across the MTJ is close to 0V. Variations in MTJ characteristics are assumed to be Gaussian with $\sigma/\mu=2\%$ for $R_P$ and $\sigma/\mu=2\%$ for the Tunneling Magnetoresistance Ratio (TMR, defined as $R_{AP}/R_P-1$). A 45 nm commercial bulk CMOS model was used for the access transistor. Supply voltage (VDD) is 1V and the width of the access transistor is 300 nm.

Figure 3:
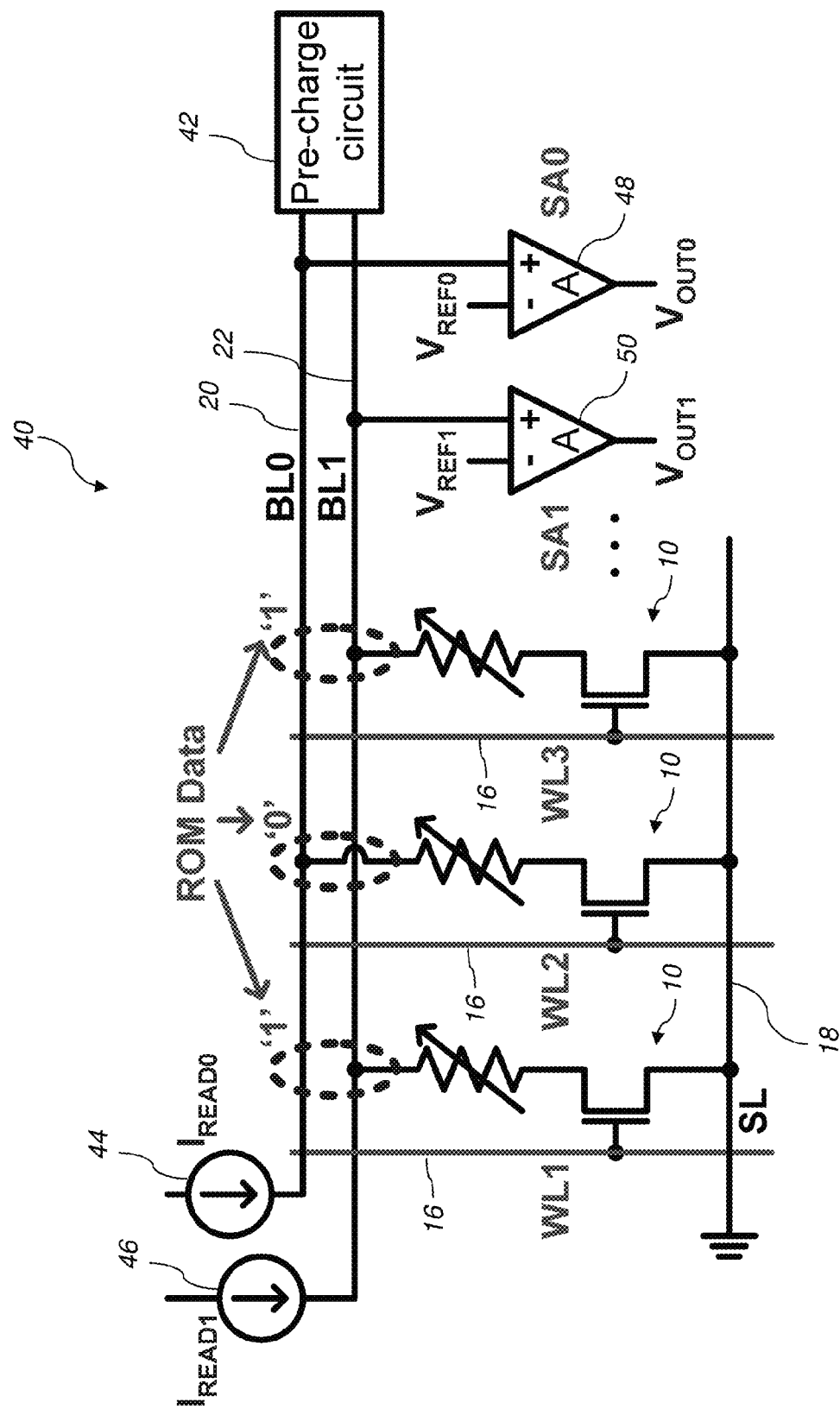
FIG. 3 shows a memory device having multiple bit cell structures including both ROM and RAM data storage according to one embodiment.

RAM Mode Read/Write Operations Using the MTJ State:

In the RAM mode, separate write drivers are needed to drive the two bit-lines 20 and 22 so that the MTJ 12 state can be switched. Note the R-MRAM requires two write drivers and each write driver has the same design considerations as the write driver in conventional STT MRAM. Therefore, biasing conditions of the access transistor 14 during write operations of R-MRAM are exactly the same as those of the conventional STT MRAM. FIG. 3 shows a memory device 40 that includes a plurality of the bit cell structures 10. The device 40 also includes a pre-charge circuit 42, two current sources 44 and 46, and two sensing amplifiers 48 and 50 connected as shown.

Compared to the read operation of conventional STT MRAM, the R-MRAM of the present disclosure (such as bit-cell 10 or device 40) requires one additional current source as well as sense amplifier as shown in FIG. 3. R-MRAM data needs to be sensed both bit-lines because the R-MRAM bit-cell in different rows may be connected to different bit-lines—sensing from one bit-line allows data to be sensed from one bit-cell 10 but not the other. Both bit-lines 20 and 22 are pre-charged by circuit 42 to a reference voltage ($V_{REF}=V_{REF0}=V_{REF1}$ in FIG. 3), which is determined to be the read current ($I_{READ}$) multiplied by the average value of $R_{AP}$ and $R_P$ to maximize sensing margin of the sense amplifier 48 or 50, before the current sources 44 and 46 are turned on. The voltage of a disconnected bit-line increases linearly since the current source charges the bit-line capacitance as if $R_{MTJ}$ is infinitely high. On the other hand, a connected bit-line is discharged or charged to the voltage level determined by $I_{READ} \times R_{MTJ}$. Hence, one bit-line always produces a voltage higher than $V_{REF}$ while the other one produces a voltage higher or lower than $V_{REF}$ depending on the MTJ state of the selected bit-cell 10. Read data in the RAM mode can then be determined by a two-input 'AND' gate (assuming the AP and P MTJ states represent '1' and '0', respectively) with inputs from $V_{OUT0}$ and $V_{OUT1}$ (which are the output voltages of sense amplifiers 48 and 50, respectively, as shown in FIG. 3).

Figure 4A:
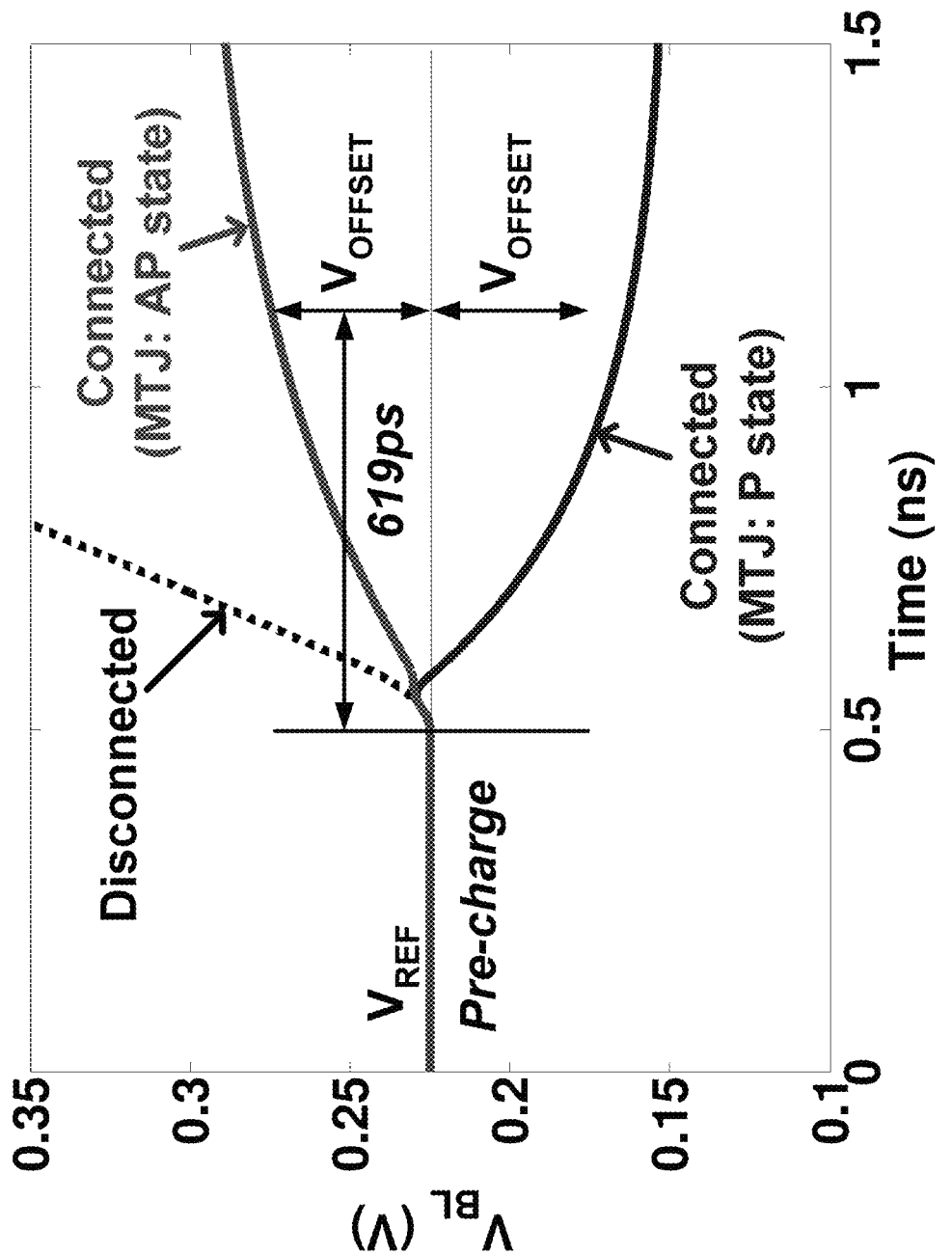
FIG. 4A shows bit line voltage transitions during RAM mode read operation using the device of FIG. 3.

In 45 nm technology, the bit-line capacitance of an SRAM sub-array of 16 Kbits is ~100 fF. FIG. 4A shows bit-line voltages when bit-lines are disconnected or connected, assuming an iso-area STT MRAM sub-array with the same amount of bit-line capacitance (100 fF for each bit-line). Note that bit-line voltages in steady state are determined by $I_{READ} \times R_{MTJ}$ (assuming negligible voltage drop across the access transistor 14). Using 50 μA IREAD, connected bit-lines 20 and 22 are charged or discharged to ~0.15V (with the MTJ in P state) or ~0.30V (with the MTJ in AP state) from the pre-charge voltage. However, the voltage of a disconnected bit-line directly driven by a current source is given by $$V_{disconnected} = \frac{I_{READ}}{C_{bit}} \times t_{eval} + V_{pre}$$

where $C_{bit}$ is the bit-line capacitance, $t_{eval}$ is the time elapsed after the pre-charge step, and $V_{pre}$ is the pre-charge voltage. Hence, the voltage of a disconnected bit-line increases linearly as shown in FIG. 4A. At the nominal corner, if the offset voltage ($V_{OFFSET}$) of amplifiers 48 and 50 in FIG. 3 is 50 mV, then at least 619 ps is required after the pre-charge step such that all bit-lines generate a voltage difference larger than $V_{OFFSET}$. Under the assumed process variations, the worst case sensing delay is 687 ps. Note that R-MRAM read operations of the device 40 during RAM mode has the same read stability and performance of conventional STT MRAM read operations since the bit-cell biasing conditions are identical.

Figure 4B:
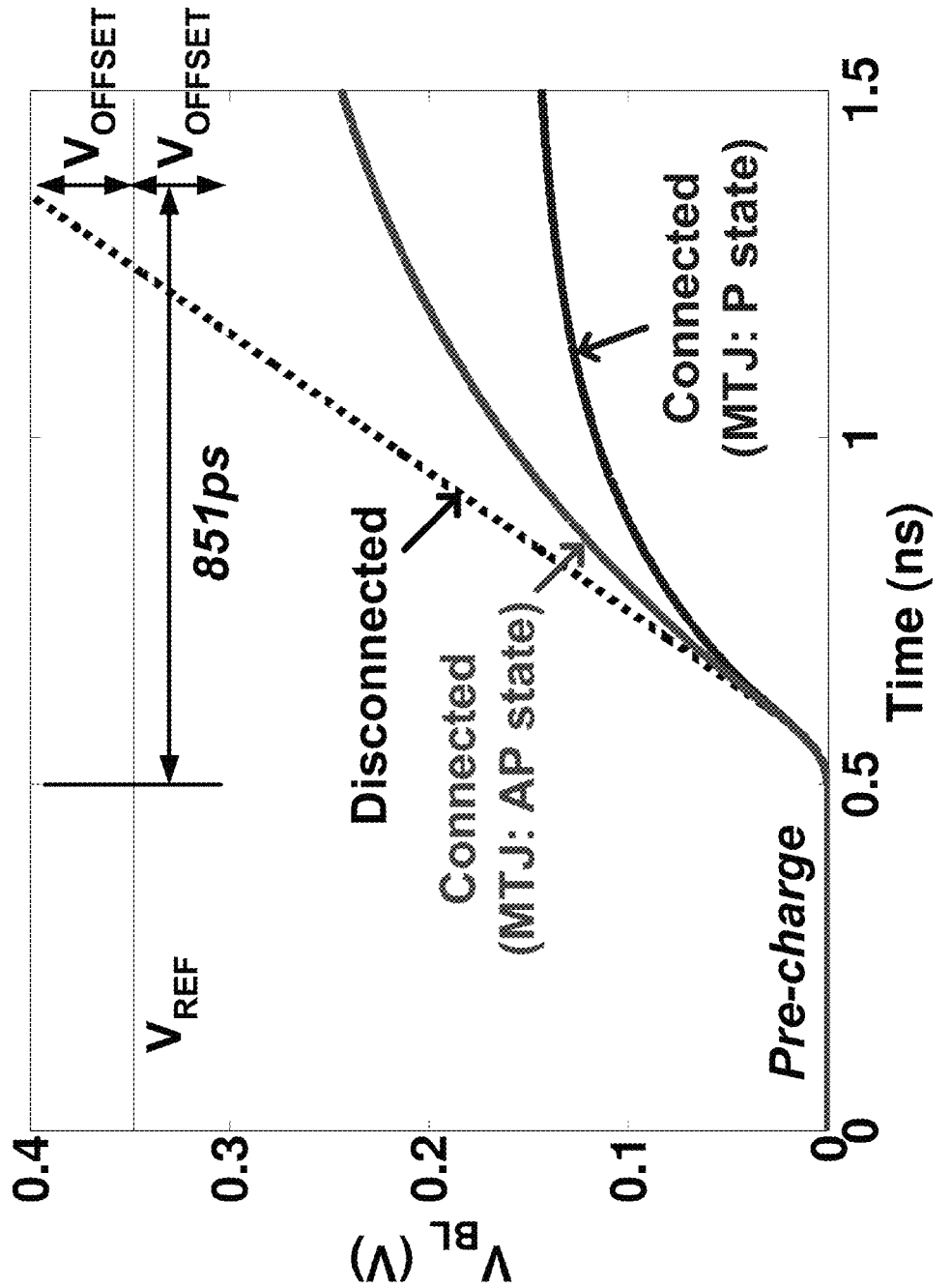
FIG. 4B shows ROM mode read operation using the device of FIG. 3.

ROM Mode Read Operations Using Bit-Line Connectivity:

Read operations in ROM mode of R-MRAM device 40 are performed using either bit line 20 or 22, which is pre-charged to 0V (see FIG. 4B0 before the word-line 16 is turned on. After pre-charging, the word-line 16 of a selected cell 10 is asserted and bit-line voltages increase up to the steady state values with different RC time constants. Note that if the MTJ is connected to bit line 20, then the maximum $V_{BL}$ is ~0.3V (in AP state). On the other hand, if the MTJ is not connected to bit line 20, then the bit-line voltage increases at a faster speed as shown in FIG. 4B compared to the case when the MTJ is connected bit line 20. In our proposed R-MRAM device 40, $V_{REF}=I_{READ} \times R_{AP}+V_{OFFSET}$ in the ROM mode is 0.35V to distinguish whether the bit-line is connected to the bit-cell or not (bit-line voltage cannot be higher than 0.3V if the bit-line is connected to the selected bit-cell 10). Assuming $V_{REF}=0.35V$ and 50 μA $I_{READ}$, 851 ps after pre-charging is required (at the nominal corner) before a voltage difference larger than $V_{OFFSET}$ appears across the sense amplifier 48 and 50 inputs. Note that process variations in the bit-cell 10 do not affect the time required for ROM data to be sensed. The ROM data determined to be '1' if $V_{OUT1}$ is $V_{DD}$ (the bit-cell is connected to bit line 22) or '0' if $V_{OUT1}$ is 0V (the bit-cell is connected to bit line 20).

Table 1 summarizes reference voltages and biasing conditions of read operations during the ROM and the RAM modes of our proposed R-MRAM. A pre-charge voltage of 0V and 50 mV offset voltage used for ROM mode operation results in fast ROM data retrieval (comparable speed of RAM mode read operations).

TABLE 1

| | RAM-Mode Read | ROM-Mode Read |
|---|---|---|
| $I_{READ1}$ | $I_{READ}$ (turned on) | 0 A (turned off) |
| $I_{READ0}$ | $I_{READ}$ (turned on) | $I_{READ}$ (turned on) |
| $V_{REF1}$ | $I_{READ} \times (R_P + R_{AP})/2$ | Don't care |
| $V_{REF0}$ | $I_{READ} \times (R_P + R_{AP})/2$ | $I_{READ} \times R_{AP} + V_{OFFSET}$ |
| BL0 Pre-charge | $I_{READ} \times (R_P + R_{AP})/2$ | 0 V |
| BL1 Pre-charge | $I_{READ} \times (R_P + R_{AP})/2$ | Don't care (floating) |
| Read Data | 0 if ($V_{OUT0}$ = 0 V) or ($V_{OUT1}$ = 0 V) 1 if ($V_{OUT0}$ = $V_{DD}$) and ($V_{OUT1}$ = $V_{DD}$) | 0 if $V_{OUT0}$ = 0 V 1 if $V_{OUT0}$ = $V_{DD}$ |

Comparison with ROM-Embedded SRAM:

Compared to the prior art ROM-embedded SRAM the R-MRAM device 40 of the present disclosure has a smaller bit-cell footprint because it uses only one access transistor 14. Furthermore, the sensing scheme in ROM mode is much simpler and does not need a write-back step as compared to R-SRAM (R-SRAM requires RAM data to be stored elsewhere in order to read ROM data). Hence, ROM data retrieval in R-MRAM device 40 of the present disclosure is more efficient compared to R-SRAM.

In various aspects, redundant columns or rows can be used for RAM data. Normal error-correction codes (ECC) and other error-correction techniques can be used in the RAM. However, ROM data will be lost if bit lines are dead. ROM data can be programmed to include ECC bits or other recovery information to permit recovery in case of loss of one or more bit line(s). Also or alternatively, ROM data could be loaded into the bit cells that store parity bits for the RAM.

In various embodiments, to transfer data from ROM to RAM, ROM is read and RAM is subsequently written. This permits writing ROM data to different addresses in RAM than in ROM. In other embodiments, ROM can be loaded to the same address in RAM.

In certain applications, the ROM data may need to be loaded into the storage elements used for storing RAM data. If data stored in the RAM location into which the ROM data is to be loaded is required later, it needs to be written into temporary buffer storage (which may be on-chip memory, or off-chip memory) first. A ROM read operation is then performed and the ROM data output is latched. Finally, the latched ROM data is written into the RAM storage.

The connection to one of the bit lines 20 or 22 is permanent for each bit cell 10, in various embodiments. The term "permanent" does not exclude electromigration and other normal physical effects in semiconductors placed into service. "Permanent" connections on a chip are connections not capable of being changed more than once by elements on the chip itself. Examples include connections hard-wired into the chip as part of the mask, e.g., of a via layer, connections laser-cut, and connections permanently blown open or shorted using an elevated programming voltage.

Steps of various methods described herein can be performed in any order except when otherwise specified, or when data from an earlier step is used in a later step. Exemplary method(s) described herein are not limited to being carried out by components particularly identified in discussions of those methods.

In view of the foregoing, various aspects provide an electronic memory device that physically stores both RAM and ROM information in such a way that either the RAM information or the ROM information can be read out. A technical effect is to store RAM and ROM data in the same bit cell, thereby improving the speed with which a computer can retrieve information. A technical effect of various aspects is to provide a visual representation on an electronic display of the results of mathematical computations performed using lookup tables stored in the ROM data of such a memory.

Figure 5:
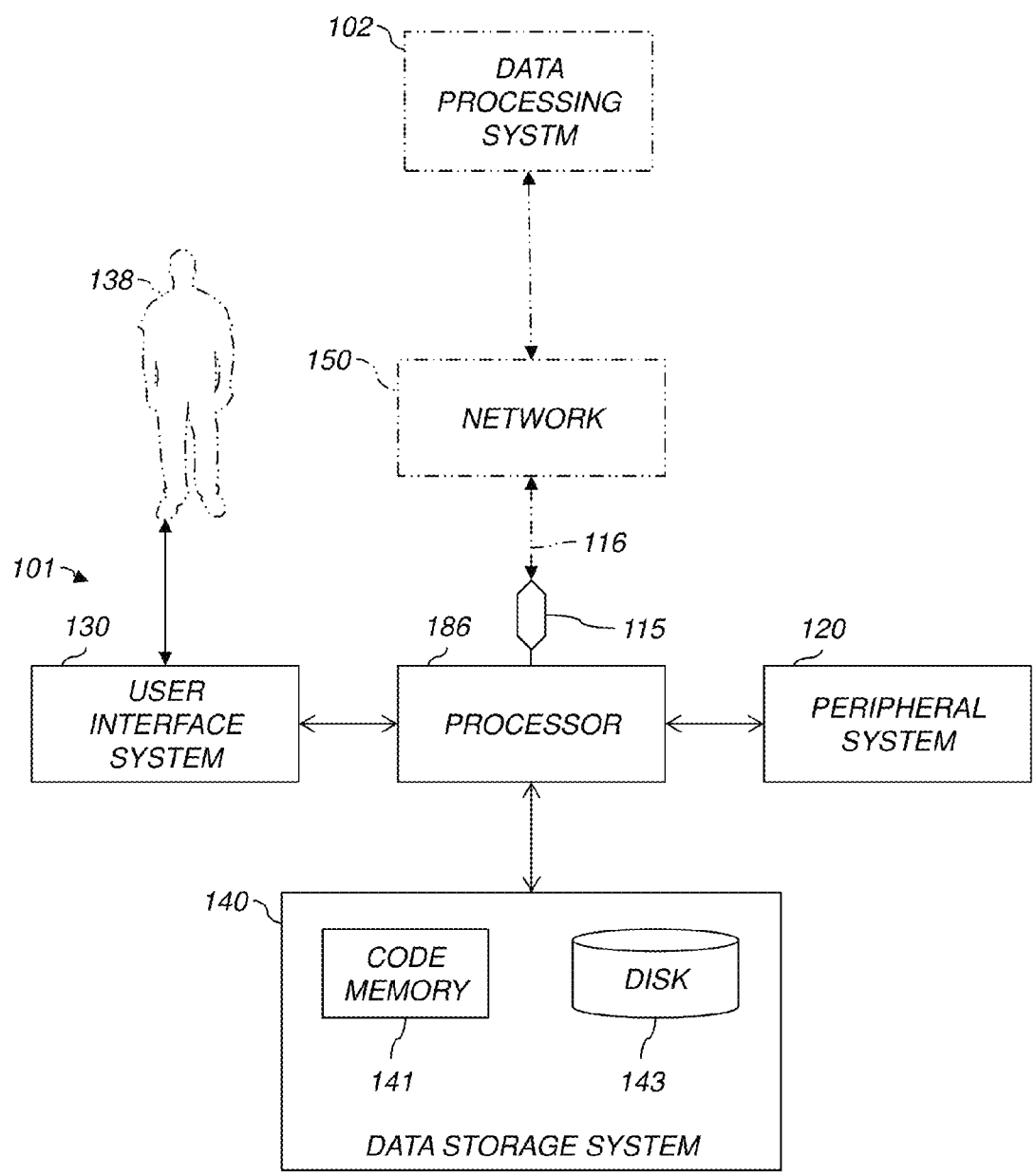
FIG. 5 is a high-level diagram showing the components of a data-processing system.

FIG. 5 is a high-level diagram showing the components of an exemplary data-processing system 101 for analyzing data and performing other analyses described herein, and related components. The system 101 includes a processor 186, a peripheral system 120, a user interface system 130, and a data storage system 140. The peripheral system 120, the user interface system 130 and the data storage system 140 are communicatively connected to the processor 186. Processor 186 can be communicatively connected to network 150 (shown in phantom), e.g., the Internet or a leased line, as discussed below. Sense amplifiers, controllers, and other devices shown in the Papers can each include one or more of systems 186, 120, 130, 140, and can each connect to one or more network(s) 150. Processor 186, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

Processor 186 can implement processes of various aspects described herein. Processor 186 and related components can, e.g., carry out processes for writing RAM, reading RAM, or reading ROM.

Processor 186 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise.

The phrase "communicatively connected" includes any type of connection, wired or wireless, for communicating data between devices or processors. These devices or processors can be located in physical proximity or not. For example, subsystems such as peripheral system 120, user interface system 130, and data storage system 140 are shown separately from the data processing system 186 but can be stored completely or partially within the data processing system 186.

The peripheral system 120 can include one or more devices configured to provide digital content records to the processor 186. For example, the peripheral system 120 can include digital still cameras, digital video cameras, cellular phones, or other data processors. The processor 186, upon receipt of digital content records from a device in the peripheral system 120, can store such digital content records in the data storage system 140.

The user interface system 130 can convey information in either direction, or in both directions, between a user 138 and the processor 186 or other components of system 101. The user interface system 130 can include a mouse, a keyboard, another computer (connected, e.g., via a network or a null-modem cable), or any device or combination of devices from which data is input to the processor 186. The user interface system 130 also can include a display device, a processor-accessible memory, or any device or combination of devices to which data is output by the processor 186. The user interface system 130 and the data storage system 140 can share a processor-accessible memory.

In various aspects, processor 186 includes or is connected to communication interface 115 that is coupled via network link 116 (shown in phantom) to network 150. For example, communication interface 115 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. Communication interface 115 sends and receives electrical, electromagnetic or optical signals that carry digital or analog data streams representing various types of information across network link 116 to network 150. Network link 116 can be connected to network 150 via a switch, gateway, hub, router, or other networking device.

In various aspects, system 101 can communicate, e.g., via network 150, with a data processing system 102, which can include the same types of components as system 101 but is not required to be identical thereto. Systems 101, 102 are communicatively connected via the network 150.

Processor 186 can send messages and receive data, including program code, through network 150, network link 116 and communication interface 115. For example, a server can store requested code for an application program (e.g., a JAVA applet) on a tangible non-volatile computer-readable storage medium to which it is connected. The server can retrieve the code from the medium and transmit it through network 150 to communication interface 115. The received code can be executed by processor 186 as it is received, or stored in data storage system 140 for later execution.

Data storage system 140 can include or be communicatively connected with one or more processor-accessible memories configured to store information. The memories can be, e.g., within a chassis or as parts of a distributed system. The phrase "processor-accessible memory" is intended to include any data storage device to or from which processor 186 can transfer data (using appropriate components of peripheral system 120), whether volatile or non-volatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 140 can be a tangible non-transitory computer-readable storage medium, i.e., a non-transitory device or article of manufacture that participates in storing instructions that can be provided to processor 186 for execution.

In an example, data storage system 140 includes code memory 141, e.g., a RAM, and disk 143, e.g., a tangible computer-readable rotational storage device such as a hard drive. Computer program instructions are read into code memory 141 from disk 143. Processor 186 then executes one or more sequences of the computer program instructions loaded into code memory 141, as a result performing process steps described herein. In this way, processor 186 carries out a computer implemented process. For example, steps of methods described herein, blocks of the flowchart illustrations or block diagrams herein, and combinations of those, can be implemented by computer program instructions. Code memory 141 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 186 (and possibly also other processors), to cause functions, acts, or operational steps of various aspects herein to be performed by the processor 186 (or other processor). Computer program code for carrying out operations for various aspects described herein may be written in any combination of one or more programming language(s), and can be loaded from disk 143 into code memory 141 for execution. The program code may execute, e.g., entirely on processor 186, partly on processor 186 and partly on a remote computer connected to network 150, or entirely on the remote computer.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A combination random-access memory (RAM) and read-only memory (ROM) electronic data-storage device, comprising:
   at least two bit lines;
   at least two current sources, each of the current sources connected to a corresponding one of the bit lines;
   a plurality of bit cells, the bit cells each comprising a series connection of a selection element and a variably-resistive storage element, the bit cells each comprising a cell input node having a permanent connection to only one of the bit lines and a cell output node connected to a source line, the selection element having a control input connected to a word line;
   a first sensing amplifier connected to a first one of the bit lines, the first sensing amplifier configured to output a first voltage when the first bit line is driven above a reference voltage and a second voltage when the first bit line is driven below the reference voltage;
   a second sensing amplifier connected to a second one of the bit lines, the second sensing amplifier configured to output the first voltage when the second bit line is driven above the reference voltage and the second voltage when the second bit line is driven below the reference voltage.

2. The device according to claim 1, wherein the selection element comprises a transistor.

3. The device according to claim 2, wherein the transistor comprises a gate.

4. The device according to claim 3, wherein the transistor gate is connected to a word line.

5. The device according to claim 1, wherein the resistive storage element is a magnetic tunnel junction.

6. The device according to claim 1, wherein the permanent connection between the bit cell and the bit line comprises a via.

* * * * *